United States Patent [19]

Komine et al.

[11] Patent Number: 4,810,830

[45] Date of Patent: Mar. 7, 1989

[54] SHIELD CASE FOR TELEVISION SIGNAL BRANCH DISTRIBUTOR

[75] Inventors: Hitoshi Komine; Kiyozumi Chino, both of Tokyo, Japan

[73] Assignee: Uro Denshin Kogyo Kabushiki Kaisha, Tokyo, Japan

[21] Appl. No.: 94,278

[22] Filed: Sep. 8, 1987

[51] Int. Cl.$^4$ .............................................. H05K 9/00
[52] U.S. Cl. .............................. 174/35 GC; 361/424
[58] Field of Search ...................... 174/35 R, 35 GC; 361/424; 219/10.55 D; 455/300, 301

[30] Foreign Application Priority Data

Sep. 6, 1986 [DE]  Fed. Rep. of Germany ...... 3630426

[56] References Cited

U.S. PATENT DOCUMENTS

| | | | |
|---|---|---|---|
| 2,317,813 | 4/1943 | Schoenborn | 174/35 GC |
| 3,431,348 | 3/1969 | Nellis et al. | 174/35 GC |
| 3,555,168 | 1/1971 | Frykberg | 174/35 GC |
| 3,783,173 | 1/1974 | Twomey | 174/35 GC |
| 4,008,383 | 2/1977 | Tanaka et al. | 174/35 GC X |
| 4,662,967 | 5/1987 | Bogan et al. | 174/35 GC X |

Primary Examiner—Arthur T. Grimley
Assistant Examiner—David A. Tone
Attorney, Agent, or Firm—Emmanuel J. Lobato; Robert E. Burns

[57] ABSTRACT

A shield case for a television signal branch distributor is so configured that a mesh element serving as a shield member, which is adhered to the lower surface of the cap member by means of an adhesive member having adhesive layers on its opposite sides, is tightly fitted between a case body and a cap member adapted to be combined with the case body. The mesh element is preferably made of brass or stainless steel, and is fixed to the case body by allowing the cap member to be forced into the case body.

3 Claims, 4 Drawing Sheets

SHIELD CASE FOR TELEVISION SIGNAL BRANCH DISTRIBUTOR

BACKGROUND OF THE INVENTION

The present invention relates to a shield case for a television signal branch distributor.

Television signal branch distributors are so required that signals passing through the inside of a distributor case do not leak towards the outside. To do this, it is required to shield between the inside and the outside of the case as far as possible.

Such a shield case or box ordinarily comprises a case body 10 and a cap member 20 fitted into the case body 10, as shown in FIGS. 4a, 4b and 4c. Signals leak through a gap or gaps G formed at joint portions between the case body 10 and the cap member 20, as shown in FIG. 5. For preventing such a signal leakage, the case body 10 is provided at the edge of the opening portion with a groove to insert a shield member 30 called a "braid" into the groove, thereafter fitting the cap member 20 into the case body 10 through the shield member 30, thus providing a shield structure configured so that there is no gap between the case body 10 and the cap member 20.

However, such a structure has the following difficulties in its embodiment; because it is necessary to provide by machining a groove for inserting a braid into the opening end surface of the case body 10 and the braid is relatively expensive etc., the structure becomes complicated in its fabrication and becomes costly.

SUMMARY OF THE INVENTION

With the above in view, an object of the present invention is to provide a television signal branch distributor which can be simply fabricated at a low cost and which has little possibility that signal leakage is produced.

To achieve this object, the present invention provides a shield case for a television signal branch distributor configured so that a shield member of a mesh element or a perforated element identical thereto is fitted or held between a case body and a cap member.

DETAILED DESCRIPTION OF THE PREFERRED EMBODIMENT

A preferred embodiment of a shield case for a television signal branch distributor according to the invention will be described with reference to FIGS. 1 to 3.

Figure 1:
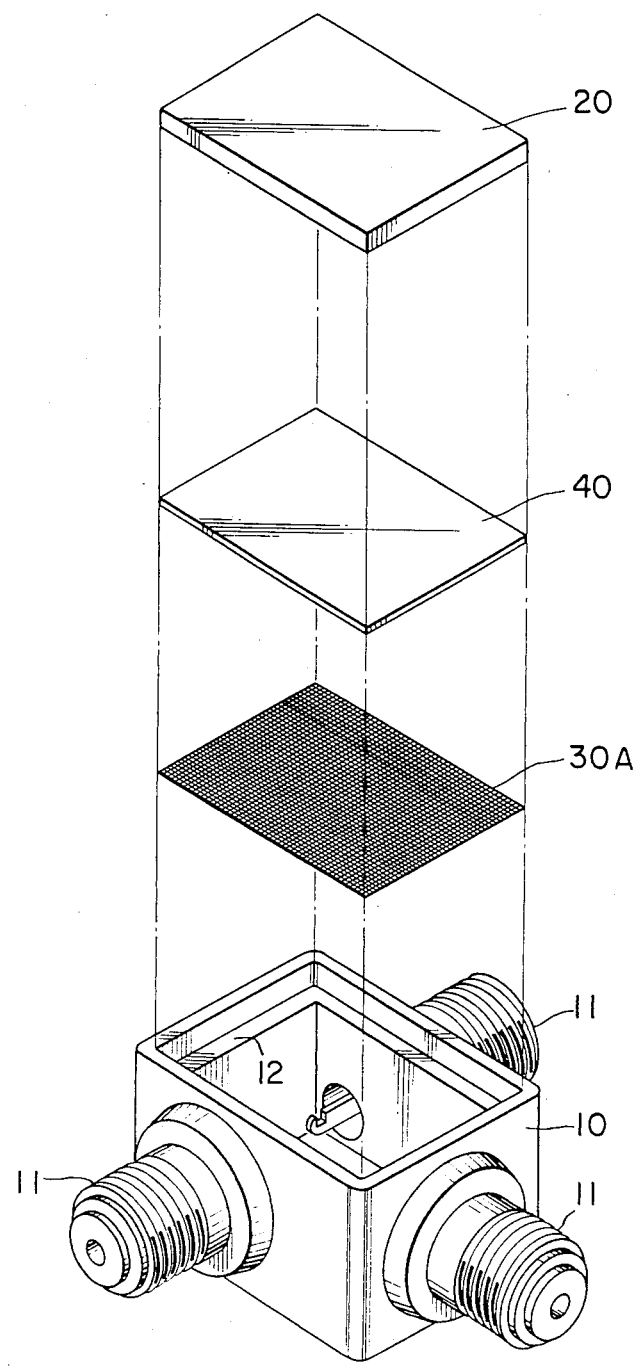
FIG. 1 is an exploded perspective view illustrating an embodiment of a shield case according to the present invention.

As shown in FIG. 1, the shield case of the embodiment according to the present invention comprises a case body 10 having an opening at its upper end, a cap member 20 fitted into the opening of the case body 10, and a shield member of a substantially uniplanar mesh element fitted between the case body 10 and the cap member 20. More particularly, the case body 10 has four side walls and a bottom which are made of e.g. aluminum or zinc etc. and integrally formed with each other. The case body 10 is provided at the three side walls with three connector terminals 11 for serving as a signal branch distributor, respectively. The cap member 20 is made of e.g. aluminum or zinc etc. The cap member 20 has a dimension adapted so that it can be forced into the case body 10. When the cap member 20 is forced into the case body 10, the mesh element 30A is fitted between the cap member 20 and the peripheral edge of the opening of the case body 10 together with an adhesive member 40, which is constructed as an elastic sheet sized substantially equal to the mesh element 30A and is provided with adhesive layers on its opposite surfaces to adhere the mesh element 30A to the lower surface of the case body 10 securely. The shield member 30A is preferably made of e.g. brass or stainless steel and may be comprised of a perforated element identical to the mesh element.

The case body 10 is further provided at the peripheral edge of the opening with a step portion 12 for making the cap member 20, the adhesive member 40 and the mesh element 30A in contact therewith. Namely, the mesh element 30A is adhered to the lower surface of the cap member 20 securely by the adhesive member 40 so that the mesh element 30A contacts at its peripheral edge to the step portion 12 intimately. Accordingly, the mesh element 30A is fitted or held at its peripheral edge between the step portion 12 and the peripheral edge portion of the cap member 20 in good contacting relation. When the cap member 20 is further forced into the case body 10, the peripheral edge portion of the mesh element 30A tightly contacts with both the step portion 12 of the case body 10 and the cap member 20, thus providing a good contact condition. Accordingly, the case body 10 and the cap member 20 are incorporatedly joined through the mesh element 30A, forming a shield case having a good shielding ability.

Figure 2A:
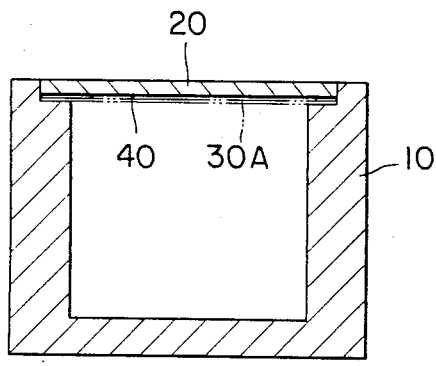
FIGS. 2a and 2b are explanatory views in cross section showing arrangement examples of a shield member fitted between a case body and a cap member, respectively.
Figure 2B:
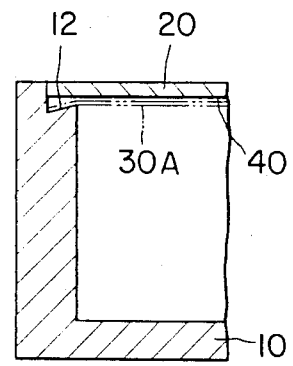
Figure 5:
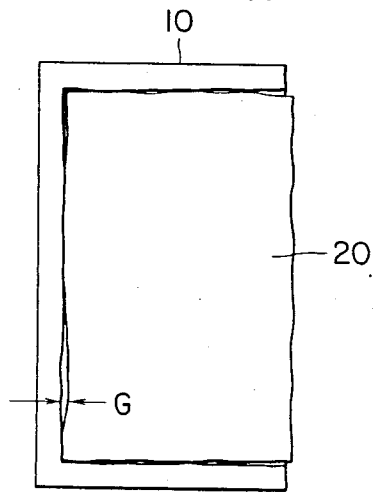
FIG. 5 is an explanatory plan view in part of a conventional shield case.

Referring to FIGS. 2(a) and 2(b), there are shown arrangement examples of the mesh element 30A and the adhesive member 40 to be fitted between the case body 10 and the cap member 20, respectively. The arrangement structure shown in FIG. 2(a) is such that the mesh element 30A and the adhesive member 40 have a dimension substantially equal to that of the cap member 20, thus making it possible to hold the mesh element 30A and the adhesive member 40 between the peripheral portion of the lower surface of the cap member 20 and the case body 10. This structure can tightly hold the mesh element 30A and the adhesive member 40 between the case body 10 and the cap member 20 to provide portions at which the case body 10, the cap member 20, the shield member 30A and the adhesive member 40 are in mechanical contact with each other. Thus, the case body 10 and the cap member 20 can be securely joined to each other, giving rise to little possibility of signal leakage.

Furthermore, the structure shown in FIG. 2(b) is such that the step portion 12 of the case body 10 is formed with an inclined portion serving as a rib to force the top portion of the rib into the peripheral edge of the mesh element 30A in cooperation with the adhesive member 40 . The structure is characterized in that the rib of the case body 10 is in contact with the cap member 20 through the mesh element 30A, thus providing a good contact between the case body 10 and the cap member 20, resulting in little possibility of signal leakage.

Among these structures, those shown in FIGS. 2(a) and 2(b) can be constituted only by additionally fitting the mesh element into the case body 10 available in the art. In other words, cancellation of the mesh element 30A and the adhesive member 40 from the structures shown in FIGS. 2(a) and 2(b) substantially results in prior art shield case. For this reason, by implementing a slight modification or change to the known shield case, it is possible to improve a signal leakage characteristic to a great extent.

Figure 3:
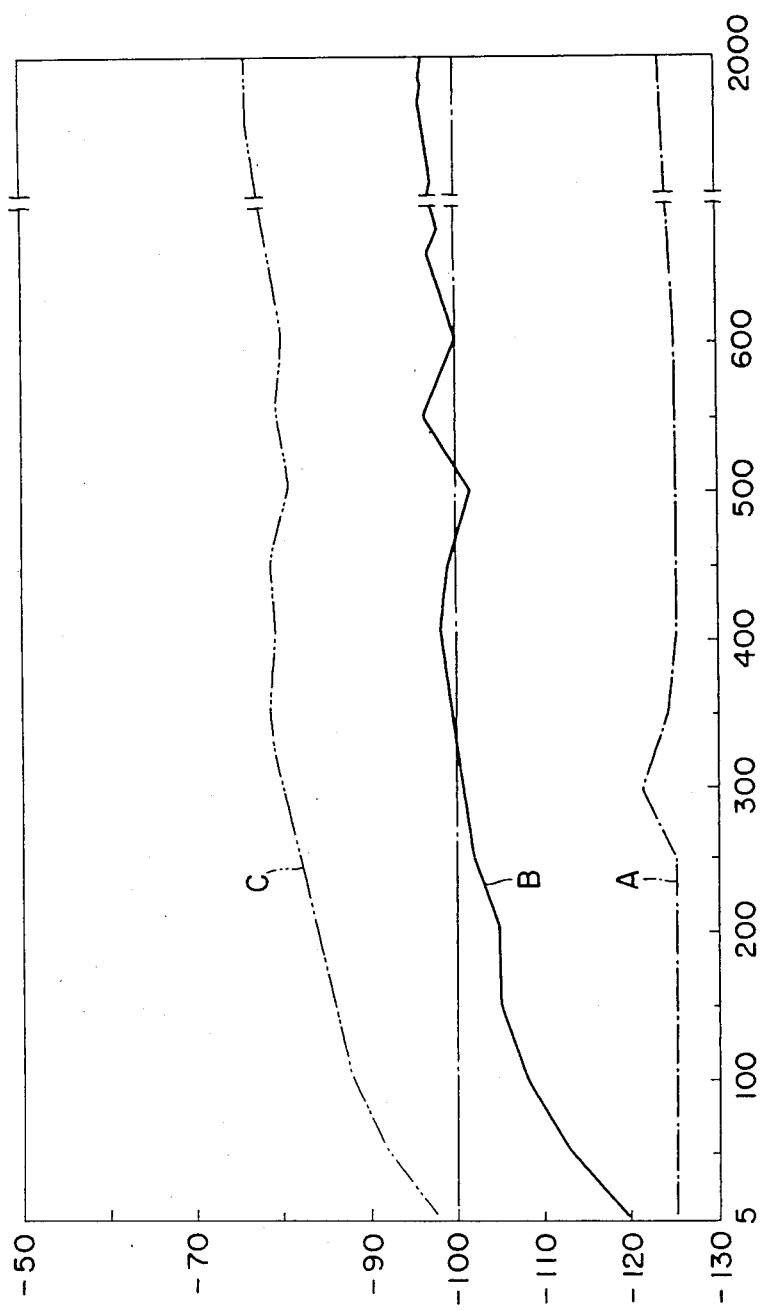
FIG. 3 is a graph showing a signal leakage characteristic of a shield case according to the present invention.
Figure 4A:
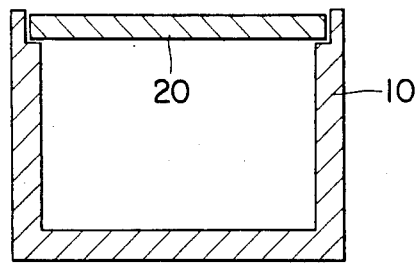
FIGS. 4a, 4b and 4c are explanatory views in cross section illustrating conventional shield cases, respectively.
Figure 4B:
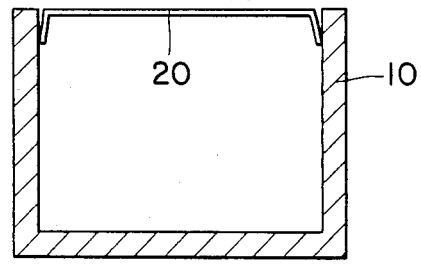
Figure 4C:
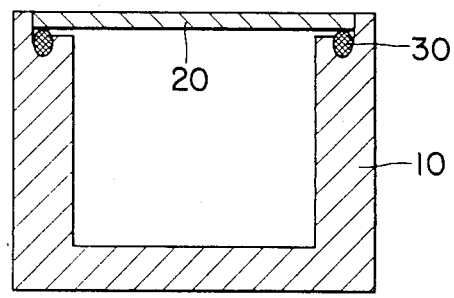

FIG. 3 shows signal leakage characteristics of the shield case according to the present invention under various conditions. The characteristic has been observed with a method of IEC-169-1. The abscissa and the ordinate denote a frequency (MHz) and a signal loss (i.e. signal leakage) (dB), respectively. The standard or allowable loss in respect of each frequency is 100 (dB).

The curve labelled A denotes the signal leakage characteristic of the shield case according to the present invention. As seen from this figure, the signal loss in the case of the curve A is approximately more than 120 (dB), giving an extremely excellent signal leakage characteristic. On the contrary, the curve labelled B denotes the case where the mesh element is removed from the shield case employed in the present invention. The signal loss in the case of the curve B is nearly equal to the standard one. Further, the curve labelled C denotes the case where the mesh element is employed, but the cap member is not employed. With the shield structure indicated by the curve C, it is seen that the standard loss cannot be guaranteed.

From the above study, it is appreciated that the provision of both the mesh element and the cap member leads to a good signal leakage characteristic.

In the above-mentioned embodiment, when the cap member 20 is formed with a transparent member of plastic etc., it is possible to observe the interior of the shield case from the outside. Accordingly, this is convenient in confirming whether circuit components assembled in an internal circuit etc. are thermally deformed while an operator visually observes them, or in adjustment or exchange thereof based on the observation. In this respect, in the prior art, a cap member for a shield case is formed with an opaque member which cannot be viewed from the external. For this reason, it is necessary to remove the cap member from the case body in order to observe the interior of the shield case or effect an adjustment. This results in the difficulties that electric characteristics or circuit constants inside the shield case are changed.

As described above, the shield case according to the present invention is configured such that the shield member, which is adhered to the lower surface of the cap member by means of an adhesive member having adhesive layers on opposite sides, is tightly fitted by forcing it into the case body together with the cap member. If the cap member is made of electrically conductive material e.g. metal, there can be provided a double-layer shield instead of a single-layer shield consisting of the cap member or the mesh element. Accordingly, the shield case of the invention can be simply fabricated and has little signal leakage because the shield member contacts the case body intimately with the help of adhesive member which is appropriately elastic and is easy to process.

Further both the cap member and the shield member are produced at once by press working, because they are attached each other with the adhesive member.

What is claimed is:

1. A shield case for a television signal branch distributor comprising:
   (a) a case body having an opening portion;
   (b) a cap member adapted to be fitted into said opening portion of said case body to make tight contact therewith;
   (c) a shield member of a mesh element to be fitted between said opening portion of said case body and said cap member; and
   (d) an adhesive member having adhesive layers on opposite surfaces thereof to be inserted between said cap member and said shield member for adhering these two members to each other.

2. A shield case for a television signal branch distributor as set forth in claim 1, wherein said case body is provided with a step portion along a peripheral edge of said opening portion which is located inside of said case body and depressed with respect to an end surface of said opening portion, said step portion being formed as a rib at its inner periphery.

3. A shield case for a television signal branch distributor as set forth in claim 1, wherein said cap member is made of electrically conductive material.

* * * * *